(12) United States Patent
Yamashita et al.

(10) Patent No.: US 12,111,989 B2
(45) Date of Patent: *Oct. 8, 2024

(54) METHOD FOR ADJUSTING RESONANCE FREQUENCY OF RESONANCE CIRCUIT INCLUDED IN ELECTRONIC PEN, ELECTRONIC PEN, AND METHOD FOR MANUFACTURING ELECTRONIC PEN

(71) Applicant: Wacom Co., Ltd., Saitama (JP)

(72) Inventors: Shigeru Yamashita, Saitama (JP); Masamitsu Ito, Saitama (JP); Toshihiko Horie, Saitama (JP)

(73) Assignee: Wacom Co., Ltd., Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/365,892

(22) Filed: Aug. 4, 2023

(65) Prior Publication Data
US 2023/0376133 A1 Nov. 23, 2023

Related U.S. Application Data

(63) Continuation of application No. 17/824,347, filed on May 25, 2022, now Pat. No. 11,762,487, which is a continuation of application No. PCT/JP2019/049062, filed on Dec. 13, 2019.

(51) Int. Cl.
*G06F 3/038* (2013.01)
*G06F 3/0354* (2013.01)
*H03H 11/02* (2006.01)

(52) U.S. Cl.
CPC ........ *G06F 3/0383* (2013.01); *G06F 3/03545* (2013.01); *H03H 11/02* (2013.01)

(58) Field of Classification Search
CPC ............... G06F 3/0383; G06F 3/03545; G06F 2203/0384; H03H 11/02
See application file for complete search history.

(56) References Cited

U.S. PATENT DOCUMENTS

2010/0311371 A1 12/2010 Abe et al.
2013/0329335 A1 12/2013 Obata
2014/0009863 A1 1/2014 Obata
(Continued)

FOREIGN PATENT DOCUMENTS

JP         6320231 B2      4/2018
WO    2016/056299 A1      4/2016

OTHER PUBLICATIONS

International Search Report, mailed Feb. 25, 2020, for International Application No. PCT/JP2019/049062. (4 pages) (with English translation).

*Primary Examiner* — Jonathan A Boyd
(74) *Attorney, Agent, or Firm* — Seed IP Law Group LLP

(57) ABSTRACT

A method is provided for adjusting the resonance frequency of a resonance circuit included in an electronic pen. The method uses adjusting means for adjusting the capacitance of an internal capacitor array and measuring means for measuring an alternating magnetic field generated by the resonance circuit. The method includes (1) a step of changing the state of a predetermined portion of multiple capacitive elements constituting the internal capacitor array, and (2) a step of changing, according to reference resonance frequency variations of the resonance circuit before and after the state change, the state of a portion or all of at least one capacitive element constituting the inner capacitor array other than said predetermined portion of the capacitive elements.

9 Claims, 10 Drawing Sheets

(56) References Cited

U.S. PATENT DOCUMENTS

| | | |
|---|---|---|
| 2014/0029156 A1 | 1/2014 | Obata |
| 2014/0078101 A1 | 3/2014 | Katsurahira |
| 2016/0034049 A1 | 2/2016 | Kanzaki et al. |
| 2018/0032163 A1 | 2/2018 | Park et al. |

| COMPONENT ID | $C_{aTB}$ | $C_{a1}$ | $C_{a2}$ | $C_{a3}$ | $C_{a4}$ | $C_{a5}$ | $C_{a6}$ | $C_{a7}$ | $C_{a8}$ | $C_{a9}$ |
|---|---|---|---|---|---|---|---|---|---|---|
| STANDARD VALUE [pF] | 10 | 120 | 62 | 30 | 15 | 8 | 4 | 2 | 1 | 0.5 |
| MAXIMUM VALUE [pF] | 11.5 | 138 | 71.3 | 34.5 | 17.25 | 9.2 | 4.6 | 2.3 | 1.15 | 0.575 |
| MINIMUM VALUE [pF] | 8.5 | 102 | 52.7 | 25.5 | 12.75 | 6.8 | 3.4 | 1.7 | 0.85 | 0.425 |
| MANUFACTURING ERROR | ±15% | | | | | | | | | |

F I G. 9
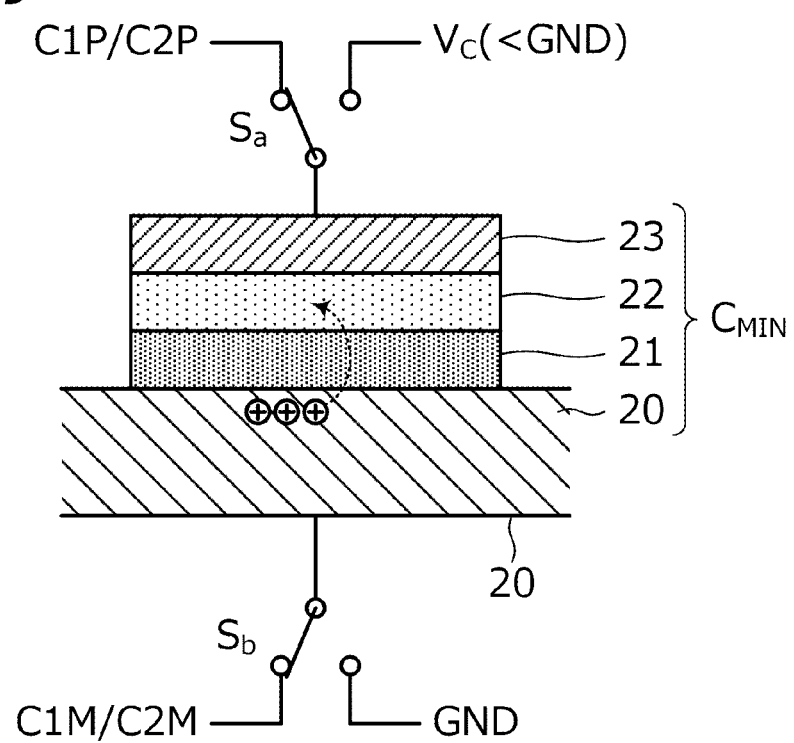

METHOD FOR ADJUSTING RESONANCE FREQUENCY OF RESONANCE CIRCUIT INCLUDED IN ELECTRONIC PEN, ELECTRONIC PEN, AND METHOD FOR MANUFACTURING ELECTRONIC PEN

TECHNICAL FIELD

The present invention relates to a method for adjusting the resonance frequency of a resonance circuit included in an electronic pen, to an electronic pen, and to a method for manufacturing the electronic pen.

BACKGROUND ART

An electronic pen for use by input systems based on the electromagnetic resonance (EMR) method includes an LC resonance circuit including a coil excited by a magnetic field transmitted from a sensor coil of a position detection apparatus and a capacitor connected in parallel with the coil (e.g., see Patent Documents 1 and 2). When the resonance circuit enters the magnetic field, the coil generates an induced electromotive force that allows the resonance circuit to accumulate electric power. The electronic pen is configured to transmit, by using the accumulated electric power, pen information including writing pressure information and side switch information.

Known specific methods for transmitting the pen information include a method of transmitting the pen information as digital information by turning on and off the supply of signals to the resonance circuit according to the content of the pen information and a method of transmitting the pen information in terms of resonance frequency variations by changing the resonance frequency of the resonance circuit according to the content of the pen information. In the description that follows, the resonance frequency of the resonance circuit used in the former method and the resonance frequency serving as a reference of resonance frequency variations in the latter method are collectively referred to as a "reference resonance frequency."

For the position detection apparatus to correctly receive the pen information transmitted from the electronic pen, it is necessary that the reference resonance frequency of the resonance circuit be equal to a predetermined standard value. However, due to manufacturing errors of the inductance of the coil or of the capacitance of the capacitor, there inevitably occur variations in the reference resonance frequency upon fabrication of the resonance circuit. For this reason, during the process of manufacturing the electronic pen, multiple capacitors are pre-arranged in parallel with each other, and after fabrication of the resonance circuit, the reference resonance frequency is measured, and according to the result of the measurement, lines are cut by laser to disconnect some of the capacitors from the circuit to make the reference resonance frequency match the standard value in an ex post facto manner. Such electronic pen designed to make the reference resonance frequency match the standard value is disclosed in Patent Document 1.

PRIOR ART

Patent Documents

Patent Document 1: Japanese Patent No. 6320231
Patent Document 2: PCT Patent Publication No. WO2016/056299

SUMMARY OF INVENTION

Technical Problems

For the purpose of matching the reference resonance frequency with the standard value, it is presumed that each of the multiple capacitors disposed in the resonance circuit has the standard capacitance value. That is, based on the standard capacitance value of each of the capacitors, the reference resonance frequency to be obtained by cutting off some of the lines is calculated, to thereby select the capacitors to be actually disconnected.

However, the capacitance values of actual capacitors have manufacturing errors and may or may not be equal to the standard value. As a result, selecting the capacitors to be disconnected in a manner based on the standard value as mentioned above may lead to inefficiency, such as when disconnecting too many capacitors to fail in properly adjusting the reference resonance frequency, or when having to repeatedly perform the process of selecting the capacitors and cutting their lines.

It is therefore an object of the present invention to provide a method for adjusting the resonance frequency of a resonance circuit included in an electronic pen in a manner to desirably adjust the reference resonance frequency; an electronic pen; and a method for manufacturing the electronic pen.

Technical Solution

According to the present invention, there is provided a method for adjusting a resonance frequency of a resonance circuit included in an electronic pen. The electronic pen includes a coil, an external capacitor, and an integrated circuit including an internal capacitor array that includes multiple capacitive elements connected in parallel. The coil, the external capacitor, and the internal capacitor array constitute the resonance circuit. The method includes (1) a state-changing step of changing a state of a predetermined portion of the multiple capacitive elements constituting the internal capacitor array, and (2) an adjusting step of changing, according to variations in the reference resonance frequency of the resonance circuit resulting from the change, a state of a portion or all of at least one capacitive element constituting the internal capacitor array other than said predetermined portion of the multiple capacitive elements. The method carries out these steps by use of adjusting means for adjusting the capacitance of the internal capacitor array and measuring means for measuring an alternating magnetic field generated by the resonance circuit.

According to the present invention, there is provided an electronic pen including a coil, an external capacitor, and an integrated circuit including an internal capacitor array that includes multiple capacitive elements connected in parallel. The internal capacitor array includes a mixture of a portion of the capacitive elements of which the state has been changed by a predetermined process and the remaining capacitive elements of which the state remains unchanged. The electronic pen is configured to transmit a signal with use of a resonance circuit including the coil, the external capacitor, and said remaining capacitive elements.

According to the present invention, a method is provided for manufacturing the electronic pen described above, using the above-outlined method.

Advantageous Effects

According to the present invention, the reference resonance frequency is adjusted in reference to an estimated variation in the capacitance of each of multiple capacitive elements. This makes it possible to suitably adjust the reference resonance frequency.

BRIEF DESCRIPTION OF DRAWINGS

FIG. 9 is a schematic cross-sectional view of a minimum capacitance cell $C_{MIN}$ as an alternative example of the first embodiment of the present invention.

DETAILED DESCRIPTION

Some preferred embodiments of the present invention are described below in detail with reference to the accompanying drawings.

Figure 1:
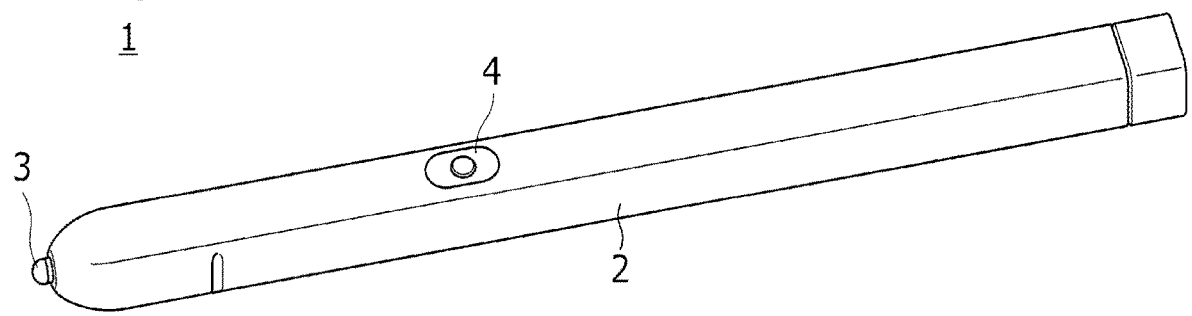
FIG. 1 is a diagram depicting an external appearance of an electronic pen 1 as a first embodiment of the present invention.

FIG. 1 is a diagram depicting an external appearance of an electronic pen 1 as a first embodiment of the present invention. As depicted in FIG. 1, the electronic pen 1 includes a cylindrical housing 2, a pen tip member 3 disposed at one end of the housing 2 in a longitudinal direction, and an operation switch 4 disposed on the surface of the housing 2. When located on the side surface of the housing 2, the operation switch 4 may be referred to as a side switch; when located at the end of the housing 2, the operation switch 4 may be called a tail switch.

A user using the electronic pen 1 holds the housing 2 by one hand, and makes input to a position detection apparatus (not illustrated) by moving the electronic pen 1 on a touch surface of the apparatus in such a manner that the pen tip member 3 remains in contact with the touch surface. At the time of input, the electronic pen 1 and the position detection apparatus communicate with each other by the above-mentioned EMR method. The electronic pen 1 is configured to transmit, through the communication, pen information including writing pressure information indicative of the pressure (i.e., writing pressure) applied to the pen tip member 3 and switch information indicative of an on/off-state of the operation switch 4. As will be discussed later in detail, the electronic pen 1 is configured to transmit the pen information in terms of resonance frequency variations by varying the resonance frequency of the resonance circuit according to the content of the pen information.

Figure 2:
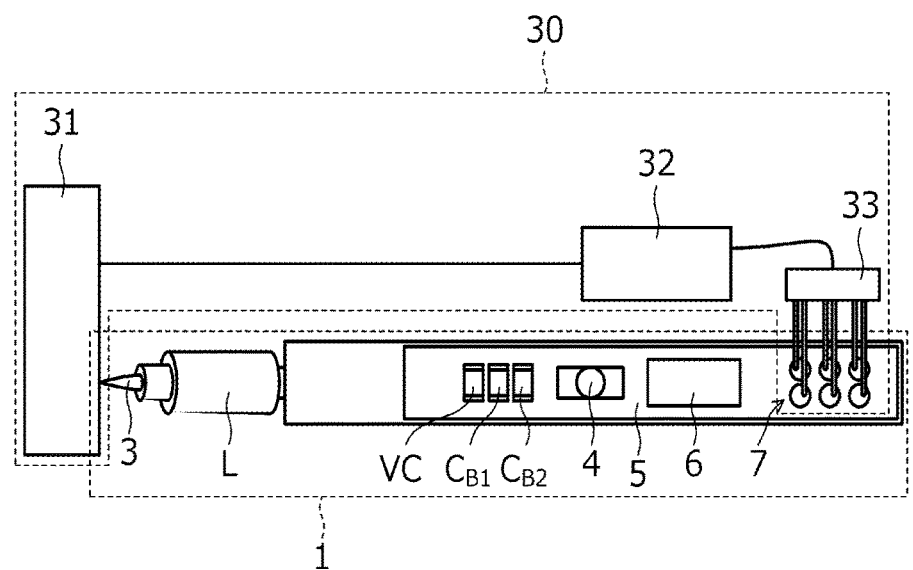
FIG. 2 is a top view depicting a structure disposed in a housing 2 illustrated in FIG. 1.
Figure 3:
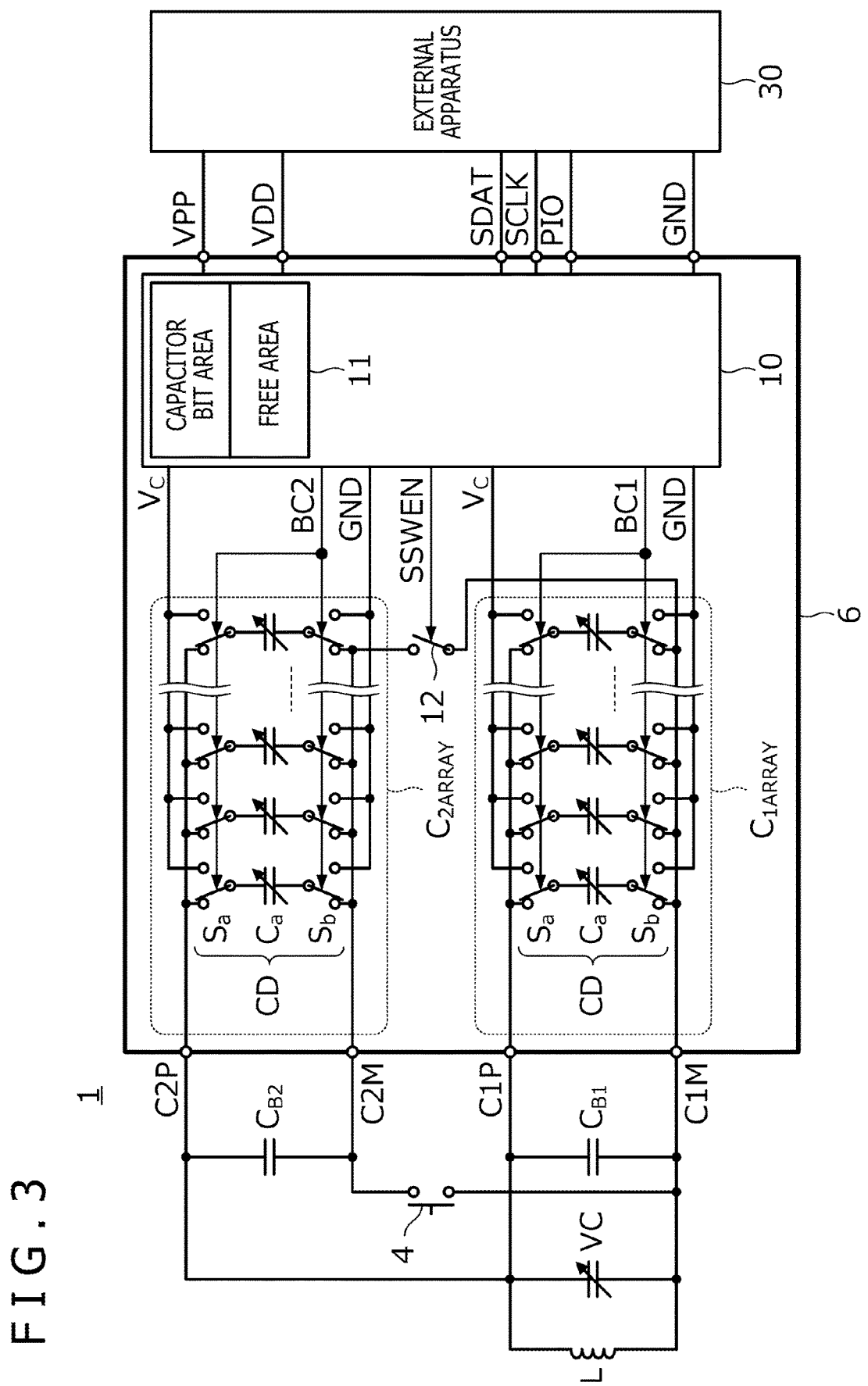
FIG. 3 is a diagram depicting a circuit configuration of an integrated circuit 6 and the electronic pen 1 as the first embodiment of the present invention.

FIG. 2 is a top view depicting a structure disposed in the housing 2 illustrated in FIG. 1. FIG. 2 includes an external apparatus 30 used to adjust the reference resonance frequency of the resonance circuit in the electronic pen 1. FIG. 3 is a diagram depicting a circuit configuration of the electronic pen 1 and an integrated circuit 6.

As depicted in FIG. 2, a substrate 5 is disposed in the housing 2. Arranged on the upper side of the substrate 5 are an integrated circuit 6, a variable capacitance capacitor VC, fixed capacitance capacitors $C_{B1}$ and $C_{B2}$, and multiple pads 7 in addition to the operation switch 4 also depicted in FIG. 1. A coil L is interposed between the substrate 5 and the pen tip member 3. Although not depicted, these components are electrically connected with one another typically by lines disposed on the substrate 5. The variable capacitance capacitor VC and the fixed capacitance capacitors $C_{B1}$ and $C_{B2}$ are external capacitors in the sense that they are provided outside of the integrated circuit 6.

As will be understood from FIG. 3, the variable capacitance capacitor VC and the fixed capacitance capacitors $C_{B1}$ and $C_{B2}$, together with the coil L, constitute a resonance circuit (LC resonance circuit) of the electronic pen 1. The reason the fixed capacitance capacitors $C_{B1}$ and $C_{B2}$ are provided is that the capacitance of capacitor arrays $C_{1ARRAY}$ and $C_{2ARRAY}$ (to be discussed later) disposed in the integrated circuit 6 is not sufficient as the capacitance of the resonance circuit. If the capacitance of the capacitor arrays $C_{1ARRAY}$ and $C_{2ARRAY}$ is made sufficiently large in the future, the fixed capacitance capacitors $C_{B1}$ and $C_{B2}$ may be omitted.

The external apparatus 30 includes a measurement apparatus 31 (measuring means) for measuring an alternating magnetic field generated at the pen tip of the electronic pen 1 (by the resonance circuit in the electronic pen 1), an adjustment apparatus 32 (adjusting means) for adjusting the capacitance of the capacitor arrays $C_{1ARRAY}$ and $C_{2ARRAY}$, and a probe 33 connected to the integrated circuit 6 via the multiple pads 7. The external apparatus 30 is attached to the electronic pen 1 for adjusting the capacitance of the capacitor arrays $C_{1ARRAY}$ and $C_{2ARRAY}$ during part of the manufacturing process of the electronic pen 1, and is detached from the electronic pen 1 after the capacitance adjustment.

Typically, the measurement apparatus 31 is a tablet terminal that includes a central processing unit (CPU), a memory, and a touch sensor and sensor controller for detecting the position of the electronic pen 1. The alternating magnetic field is measured by the measurement apparatus 31 as follows: First, the measurement apparatus 31 causes a predetermined current to flow through the touch sensor, thereby generating a magnetic field on the upper side of the touch sensor. Upon entry into the magnetic field, the coil L generates an induced current, causing the resonance circuit in the electronic pen 1 to resonate. This generates an alternating magnetic field, causing the touch sensor to generate a current reflecting the magnitude of the alternating magnetic field. The measurement apparatus 31 measures this current to measure the alternating magnetic field. As will be discussed later in detail, there are two resonance circuits (first and second resonance circuits described later) with different reference resonance frequencies provided in a mutually exclusive manner in the electronic pen 1. One of the two resonance circuits is selected to be active by operation of the operation switch 4. Thus, at the time of measuring the reference resonance frequency, preferably the operation switch 4 is operated according to which of the two resonance circuits is the targeted of measurement.

The measurement apparatus 31 is further configured to be able to perform various processes necessary for configuring the electronic pen 1, with the CPU reading relevant programs from the memory for execution. The processes thus executed include one in which the current value of the reference resonance frequency of the resonance circuit in the electronic pen 1 is acquired in reference to the result of measurements of the alternating magnetic field and, in reference to the acquired current value and the standard value, the capacitance of the capacitor arrays $C_{1ARRAY}$ and $C_{2ARRAY}$ is adjusted via the adjustment apparatus 32 and the integrated circuit 6, so that the reference resonance frequency of the resonance circuit in the electronic pen 1 is adjusted accordingly. This process will be explained later in detail with reference to FIGS. 5A through 8.

The adjustment apparatus 32 includes electronic components included in a printed circuit assembly (PCA) board, and is connected to the integrated circuit 6 via the probe 33. The adjustment apparatus 32 adjusts the capacitance of the capacitor arrays $C_{1ARRAY}$ and $C_{2ARRAY}$ by receiving from the measurement apparatus 31 an instruction including specific adjustment details (i.e., capacitance adjustment setting instructions) and by performing a writing operation to a capacitor bit area (to be discussed later) in the integrated circuit 6 according to the instruction.

With attention again directed to the inside of the electronic pen 1, the variable capacitance capacitor VC is configured to vary its capacitance according to the writing pressure applied to the pen tip member 3. The fixed capacitance capacitors $C_{B1}$ and $C_{B2}$ are each connected in parallel with the variable capacitance capacitor VC, thereby serving to adjust, at the design stage, the reference resonance frequency of the resonance circuit in the electronic pen 1.

The integrated circuit 6 includes a control circuit 10 including a memory 11, a switch 12, two capacitor arrays $C_{1ARRAY}$ and $C_{2ARRAY}$ (internal capacitor arrays), terminals C1P, C1M, C2P, and C2M connected to the resonance circuit, and various pins for receiving input of voltages, currents, signals, and commands from the external apparatus 30 (external adjusting means). The various pins are connected one on one with the multiple pads 7 depicted in FIG. 2. Typically, the pins include a power supply terminal VPP supplied with a potential VPP from the external apparatus 30; a power supply terminal VDD supplied with a potential VDD (<VPP) from the external apparatus 30; a ground terminal GND supplied with a ground potential GND (<VDD) from the external apparatus 30; a data terminal SDAT supplied with suitable data SDAT (current) including commands from the external apparatus 30; a clock terminal SCLK supplied with an operation clock signal SCLK from the external apparatus 30; and a reserve terminal PIO. The reserve terminal PIO may be connected either to the external apparatus 30 or to another apparatus, not depicted. It is preferred that the terminals (including the pins) provided for the integrated circuit 6 comply with the serial bus standard I²C.

The terminal C1P is commonly connected, outside the integrated circuit 6, to one end of the variable capacitance capacitor VC, to one end of each of the fixed capacitance capacitors $C_{B1}$ and $C_{B2}$, and to one end of the coil L. The terminal C2P is short-circuited to the terminal C1P outside of the integrated circuit 6. The terminal C1M is commonly connected, outside of the integrated circuit 6, to the other end of the variable capacitance capacitor VC, to the other end of the fixed capacitance capacitor $C_{B1}$, to the other end of the coil L, and to one end of the operation switch 4. The terminal C2M is commonly connected, outside of the integrated circuit 6, to the other end of the fixed capacitance capacitor $C_{B2}$ and to the other end of the operation switch 4.

For the purpose of explanation, it is assumed that the terminals C1P and C1M are open-circuited and that the terminals C2P and C2M are open-circuited in the integrated circuit 6. In a case where the operation switch 4 is turned off, the variable capacitance capacitor VC and the fixed capacitance capacitor $C_{B1}$ are connected in parallel with the coil L. Their combined capacitance and the coil L constitute a resonance circuit. In the description that follows, this resonance circuit may be referred to as the "first resonance circuit." With the variable capacitance capacitor VC included, the resonance frequency of the first resonance circuit varies with the writing pressure. Using the first resonance circuit thus makes it possible to transmit the writing pressure in terms of resonance frequency variations.

On the other hand, in a case where the operation switch 4 is turned on, the variable capacitance capacitor VC, the fixed capacitance capacitor $C_{B1}$, and the fixed capacitance capacitor $C_{B2}$ are connected in parallel with the coil L. Their combined capacitance and the coil L constitute another resonance circuit. In the ensuing description, this resonance circuit may be referred to as the "second resonance circuit." With the variable capacitance capacitor VC included, the resonance frequency of the second resonance frequency also varies with the writing pressure. As a result, using the second resonance circuit also makes it possible to transmit the writing pressure in terms of resonance frequency variations.

Further, since the second resonance circuit is equivalent to the first resonance circuit, with the fixed capacitance capacitor $C_{B2}$ being added, the range of resonance frequency variations reflecting the writing pressure is different between the first resonance circuit and the second resonance circuit. Consequently, it is possible to implement transmission of the switch information in terms of resonance frequency variations by switching between the first and second resonance circuits depending on the operation switch 4 being turned on or off.

The capacitor array $C_{1ARRAY}$ includes multiple capacitive elements CD each including a switch $S_a$, a capacitor $C_a$, and a switch $S_b$ connected in series in that order, the capacitive elements CD being connected in parallel between the terminals C1P and C1M. With the capacitors $C_a$ connected in parallel between the terminals C1P and C1M, the capacitor array $C_{1ARRAY}$ constitutes part of the first and the second resonance circuits.

The capacitor array $C_{2ARRAY}$ includes multiple capacitive elements CD each including a switch $S_a$, a capacitor $C_a$, and a switch $S_b$ connected in series in that order, the capacitive elements CD being connected in parallel between the terminals C2P and C2M. With the capacitors $C_a$ connected in parallel between the terminals C2P and C2M, the capacitor array $C_{2ARRAY}$ constitutes part of the second resonance circuit.

When viewed in more detail, the capacitors $C_a$ making up the capacitor arrays $C_{1ARRAY}$ and $C_{2ARRAY}$ each include one or more of numerous capacitors of a predetermined capacitance (called the "minimum capacitance cell $C_{MIN}$," hereunder) being connected in parallel. As a result, the capacitance value of each capacitor $C_a$ is an integer multiple of the capacitance value of the minimum capacitance cell $C_{MIN}$. Because each minimum capacitance cell $C_{MIN}$ is formed on the same substrate by the same process, each minimum capacitance cell $C_{MIN}$ may be considered to have the same physical properties.

Figure 4:
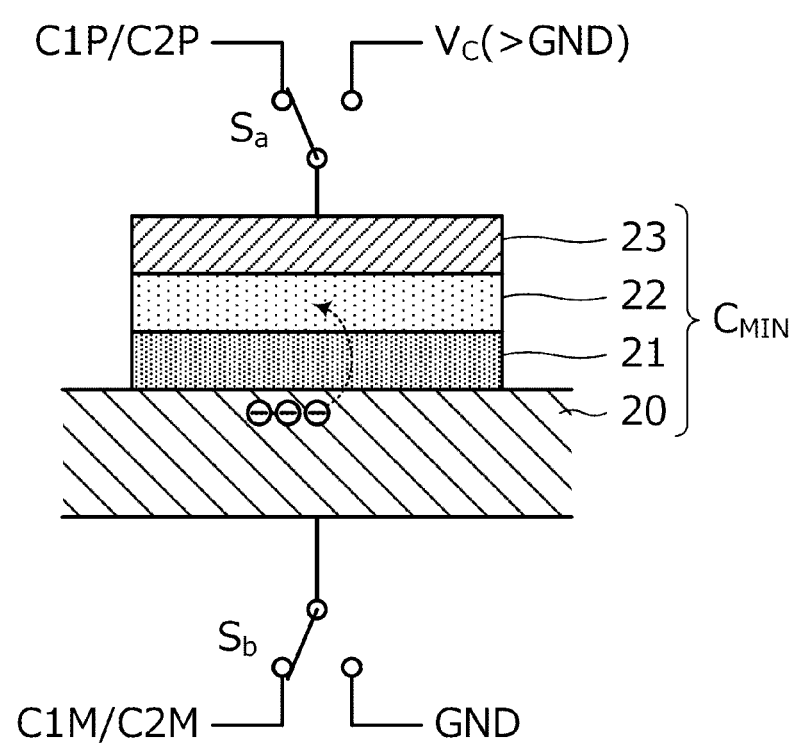
FIG. 4 is a schematic cross-sectional view of a minimum capacitance cell $C_{MIN}$.

FIG. 4 is a schematic cross-sectional view of the minimum capacitance cell $C_{MIN}$. As depicted in FIG. 4, the minimum capacitance cell $C_{MIN}$ is structured with an insulating film 21, a floating gate 22, and a gate electrode 23 stacked in that order on a substrate 20. This structure is similar to that of a floating gate type flash memory, except that the source and the drain may be provided but need not be provided.

The substrate 20 includes an n-type semiconductor such as a silicon substrate doped with n-type impurities, for example. The insulating film 21 is, for example, configured using an insulating material such as silicon oxide or silicon nitride. The gate electrode 23 is, for example, configured using an electrically conducting material such as conductive metal.

The floating gate 22 includes an n-type semiconductor such as polysilicon doped with n-type impurities, for example. It is to be noted, however, that at a stage prior to adjusting the resonance frequency, electrical charges have yet to be injected into the floating gate 22 due to depletion (i.e., initial state). As a result, if $C_O$ denotes the capacitance of the minimum capacitance cell $C_{MIN}$ prior to adjusting the reference resonance frequency, then $C_O$ is expressed by the mathematical equation (1) below, where $C_{OX}$ stands for the capacitance of the insulating film 21.

Equation 1

$$C_0 = C_{OX} \tag{1}$$

The switch $S_a$ includes three terminals: a common terminal commonly connected to the gate electrode 23 of each of at least one minimum capacitance cell $C_{MIN}$ making up the corresponding capacitor $C_a$; a first select terminal connected to the terminal C1P or C2P; and a second select terminal supplied with the potential Vc. Likewise, the switch $S_b$ includes three terminals: a common terminal commonly connected to the substrate 20 (i.e., what is generally called a back gate) of at least one minimum capacitance cell $C_{MIN}$ making up the corresponding capacitor $C_a$; a first select terminal connected to the terminal C1M or C2M; and a second select terminal supplied with the ground potential GND. In this embodiment, the potential Vc is higher than the ground potential GND. Each of the switches $S_a$ and $S_b$ has the common terminal and the first select terminal connected with each other in the initial state.

Returning to FIG. 3, the control circuit 10 adjusts the capacitance of the capacitor arrays $C_{1ARRAY}$ and $C_{2ARRAY}$, according to instructions from the external apparatus 30. Specifically, in accordance with the instructions from the external apparatus 30, the control circuit 10 changes the state of each of the capacitive elements CD in the capacitor array $C_{1ARRAY}$ by using a control signal BC1, in order to adjust the capacitance of the capacitor array $C_{1ARRAY}$. Accordingly, the control circuit 10 adjusts the reference resonance frequencies of the first and second resonance circuits. Also according to instructions from the external apparatus 30, the control circuit 10 changes the state of each of the capacitive elements CD in the capacitor array $C_{2ARRAY}$ by using a control signal BC2, in order to adjust the capacitance of the capacitor array $C_{2ARRAY}$. Accordingly, the control circuit 10 adjusts the reference resonance frequency of the second resonance circuit. The capacitive elements CD are units of control target whose states are varied by the control circuit 10. In this embodiment, the state of each capacitive element CD is varied by changing the capacitance of at least one minimum capacitance cell $C_{MIN}$ making up the capacitive element CD from the above-mentioned $C_0$ (initial state) to $C_1$ (changed state), to be described later. The changed state will be discussed later in detail.

In the memory 11 of the control circuit 10, there is provided a capacitor bit area that stores a value indicative of whether each capacitive element CD is to have its state changed or not. The value is written to the capacitor bit area by the external apparatus 30 using the above-mentioned data SDAT. The control circuit 10 is configured to generate the control signals BC1 and BC2 in reference to the values stored in the capacitor bit area, and supply the generated control signals BC1 and BC2 to the capacitor arrays $C_{1ARRAY}$ and $C_{2ARRAY}$.

The control circuit 10 is further configured to have the function of generating the potential Vc based on the potential VPP or VDD supplied from the external apparatus 30. At the beginning of starting to change the reference resonance frequency, the control circuit 10 starts supplying the potential Vc generated as described above to the second select terminal of each switch $S_a$, and starts supplying the ground potential GND fed from the external apparatus 30 to the second select terminal of each switch $S_b$.

When the reference resonance frequency is to be changed and when any of the multiple capacitive elements CD in the capacitor array $C_{1ARRAY}$ has the value indicative of a state change stored in the capacitor bit area, the control circuit 10 generates the control signal BC1 for switching each of the corresponding switches $S_a$ and $S_b$ to the second select terminal, and supplies the generated control signal BC1 to the corresponding switches $S_a$ and $S_b$. After a predetermined time period has elapsed, the control circuit 10 generates the control signal BC1 for switching each of the corresponding switches $S_a$ and $S_b$ to the first select terminal, and supplies the generated control signal BC1 to the corresponding switches $S_a$ and $S_b$.

Also, when any of the multiple capacitive elements CD in the capacitor array $C_{2ARRAY}$ has the value indicative of a state change stored in the capacitor bit area, the control circuit 10 generates the control signal BC2 for switching each of the corresponding switches $S_a$ and $S_b$ to the second select terminal, and supplies the generated control signal BC2 to the corresponding switches $S_a$ and $S_b$. After a predetermined time period has elapsed, the control circuit 10 generates the control signal BC2 for switching each of the corresponding switches $S_a$ and $S_b$ to the first select terminal, and supplies the generated control signal BC2 to the corresponding switches $S_a$ and $S_b$.

When the control circuit 10 generates and supplies the control signals BC1 and BC2 as described above, the potential Vc is applied over a predetermined time period to the capacitors $C_a$ in the capacitive element CD of which the value indicative of a state change is stored in the capacitor bit area.

Referring again to FIG. 4, while the potential Vc is being applied, the electrons within the substrate 20 are attracted to a portion near the boundary with the insulating film 21. Some of these electrons migrate into the floating gate 22 due to the tunnel effect. The electrons accumulated in this manner in the floating gate 22 remain there even after application of the potential Vc is stopped. That is, the floating gate 22 remains injected with the electrons. As a result, a depletion layer is formed in the floating gate 22. If $C_D$ is assumed to denote the capacitance of this depletion layer, the capacitance of the minimum capacitance cell $C_{MIN}$ is changed to $C_1$ expressed by the mathematical equation (2) below. This is how the state change of the capacitive element $C_D$ is accomplished.

Equation 2

$$C_1 = \frac{C_{OX} \cdot C_D}{C_{OX} + C_D} \quad (2)$$

As will be understood from the mathematical equation (2), the value $C_1$ corresponds to serial connection between the capacitance $C_{OX}$ of the insulating film 21 on one hand and the capacitance $C_D$ of the depletion layer on the other hand. Whereas the capacitance $C_D$ of the depletion layer varies according to changes in the width of the depletion layer, injecting sufficient electrons into the floating gate 22 causes the floating gate 22 to be fully depleted so that the capacitance $C_D$ eventually settles on a fixed value. It is thus preferred that the application of the potential Vc be continued until the floating gate 22 is fully depleted.

As described above, the capacitor array $C_{1ARRAY}$ constitutes part of the first and second resonance circuits. Consequently, electrons are injected into the floating gate 22 of each of at least one minimum capacitance cell $C_{MIN}$ making up each capacitor Ca in the capacitor array $C_{1ARRAY}$, so that the state of each capacitive element $C_D$ may be switched individually from the initial state discussed above to the above-described changed state. In this manner, the reference resonance frequencies of the first and second resonance circuits are changed.

The capacitor array $C_{2ARRAY}$ constitutes part of the second resonance circuit as discussed above. Consequently, electrons are injected into the floating gate 22 of each of at least one minimum capacitance cell $C_{MIN}$ making up each capacitor Ca in the capacitor array $C_{2ARRAY}$ as described above, so that the state of each capacitive element CD may be switched individually from the initial state discussed above to the above-described changed state. The reference resonance frequency of the second resonance circuit is also changed in this manner.

Other processes performed by the control circuit 10 are explained below. The control circuit 10 further has the function of controlling the enabling and disabling of the operation switch 4 in response to instructions supplied from the external apparatus 30 using the above-mentioned data SDAT. Explained in specific terms, the switch 12 is connected between the terminal C1M and the terminal C2M. In response to receiving an instruction to disable the operation switch 4, the control circuit 10 generates an enable signal SSWEN that turns on the switch 12 and supplies the generated signal to the switch 12. This causes the terminals C1M and C2M to be short-circuited in the integrated circuit 6, thereby disabling the operation switch 4. In response to receiving an instruction to enable the operation switch 4, the control circuit 10 generates an enable signal SSWEN that turns off the switch 12 and supplies the generated signal to the switch 12. This causes the terminals C1M and C2M to be disconnected in the integrated circuit 6, thereby enabling the operation switch 4.

A free area in the memory 11 is an area that stores information including a pen identification (ID) for distinguishing the electronic pen 1 from other electronic pens. The information to be stored in the free area is also written by the external apparatus 30 using the above-mentioned data SDAT. The electronic pen 1 may transmit the pen ID stored in the free area inside the memory 11 to the position detection apparatus as part of the pen information. This allows the position detection apparatus to perform different processes with different electronic pens 1 (e.g., a process of changing the drawing color for each electronic pen 1).

Explained next in detail with reference to FIGS. 5A through 8 is a process performed by the external apparatus 30 to adjust the reference resonance frequencies of the first and second resonance circuits. What follows is an explanation of a case where the reference resonance frequency of the first resonance circuit is adjusted by adjustment of the capacitance value of the capacitor array $C_{1ARRAY}$.

Figures 5A, 5B:
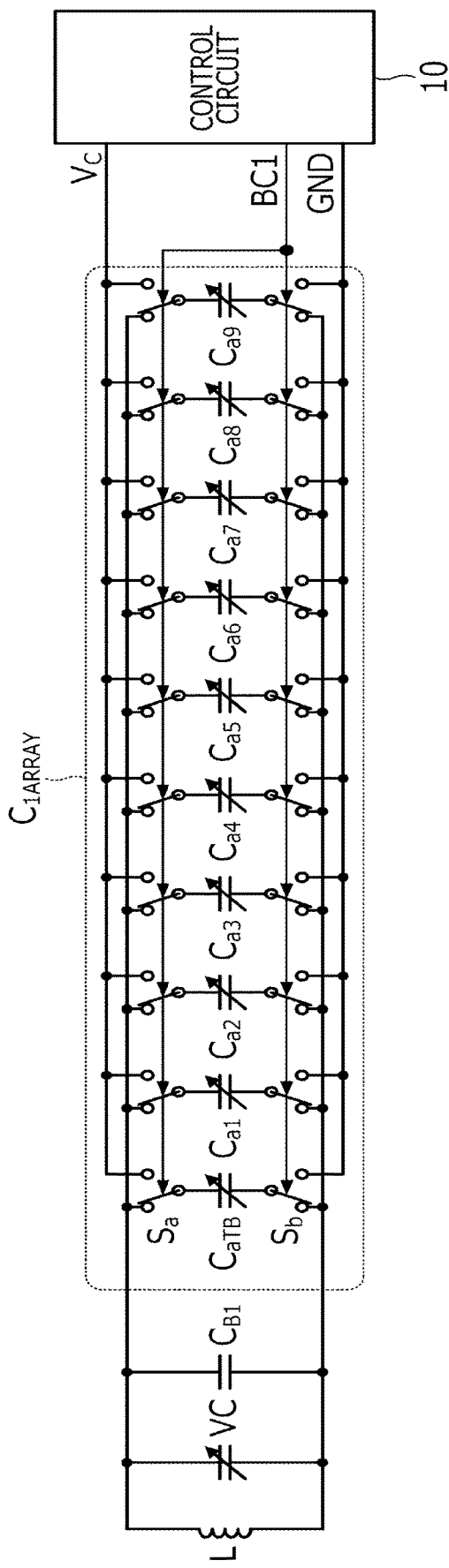
FIG. 5A is a diagram depicting a specific example of the structure of a capacitor array $C_{1ARRAY}$.
FIG. 5B is a table indicating an example of the standard value, a maximum value, a minimum value, and a manufacturing error of the capacitance variation ($=|C_1-C_0|$) resulting from application of a potential Vc to each of capacitors $C_{aTB}$ and $C_{a1}$ through $C_{a9}$ depicted in FIG. 5A.

FIG. 5A is a diagram depicting a specific example of the structure of the capacitor array $C_{1ARRAY}$. The capacitor array $C_{1ARRAY}$ depicted in FIG. 5A includes 10 capacitors $C_{aTB}$ and $C_{a1}$ through $C_{a9}$ as the capacitors $C_a$. FIG. 5A depicts only that portion of the electronic pen 1 in FIG. 3 which is related to the capacitor array $C_{1ARRAY}$, and the actual structure of the array is as illustrated in FIG. 3.

FIG. 5B is a table indicating an example of the standard value, a maximum value, a minimum value, and a manufacturing error of the capacitance variation ($=|C_1-C_0|$) resulting from application of the potential Vc to each of the capacitors $C_{aTB}$ and $C_{a1}$ through $C_{a9}$. In the example of FIG. 5B, the standard value of the capacitance variation in the above-described minimum capacitance cell $C_{MIN}$ is set to 0.5 pF. It follows that the standard values of the capacitance variations in the capacitors $C_{aTB}$ and $C_{a1}$ through $C_{a9}$ are an integer multiple of 0.5 pF each. The capacitance variations in the capacitors $C_{aTB}$ and $C_{a1}$ through $C_{a9}$ are set to be different from each other.

More specifically, as shown in FIG. 5B, the standard value of the capacitance variation in the capacitor $C_{a(9-k)}$ (k is an integer of 0 to 8) is set by multiplying the standard value 0.5 pF of the capacitance variation in the minimum capacitance cell $C_{MIN}$ by 2 to the k-th power, approximately. This is to adjust the capacitance of the capacitor array $C_{1ARRAY}$ over the widest possible range and in the most efficient manner possible. On the other hand, the standard value of the capacitance variation in the capacitor $C_{aTB}$ is set to an intermediate value between the maximum and minimum values of the capacitance variations in the capacitors $C_{a1}$ through $C_{a9}$ (e.g., to 10 pF). As will be explained below in more detail, the capacitor $C_{aTB}$ is used to estimate the manufacturing errors that may occur in the capacitance variations in the capacitors $C_{a1}$ through $C_{a9}$. Setting the standard value of the capacitor $C_{aTB}$ to the above value helps improving the accuracy of the estimation.

Figure 6A:
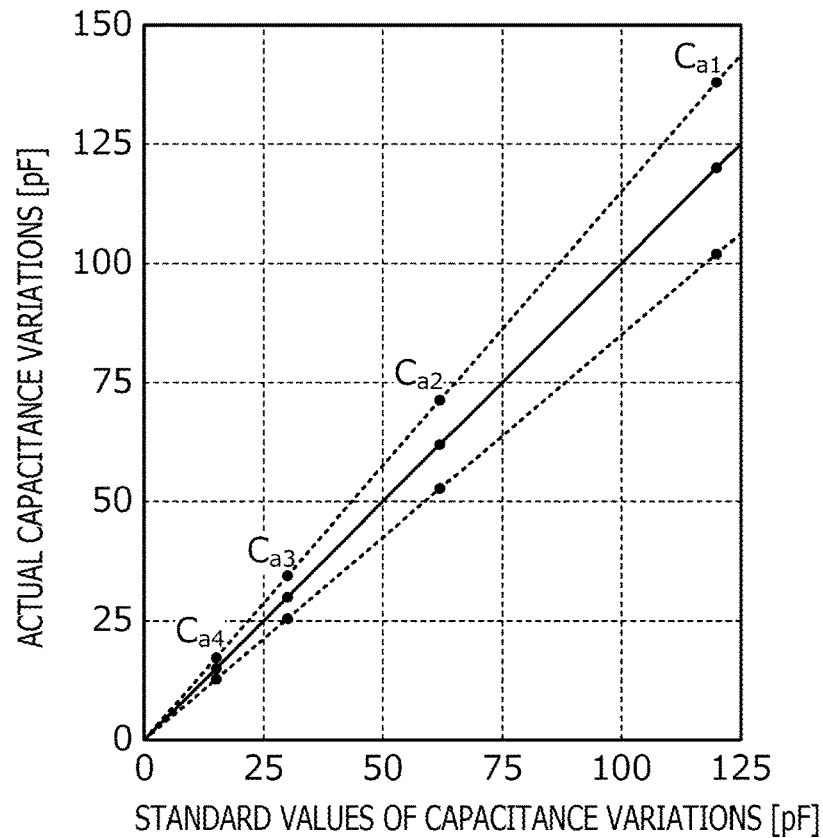
FIG. 6A is a graphic representation indicating relations between the standard values of the capacitance variations resulting from application of the potential Vc to each capacitor $C_a$ on one hand and actual capacitance variations resulting from application of the potential Vc on the other hand.
Figure 6B:
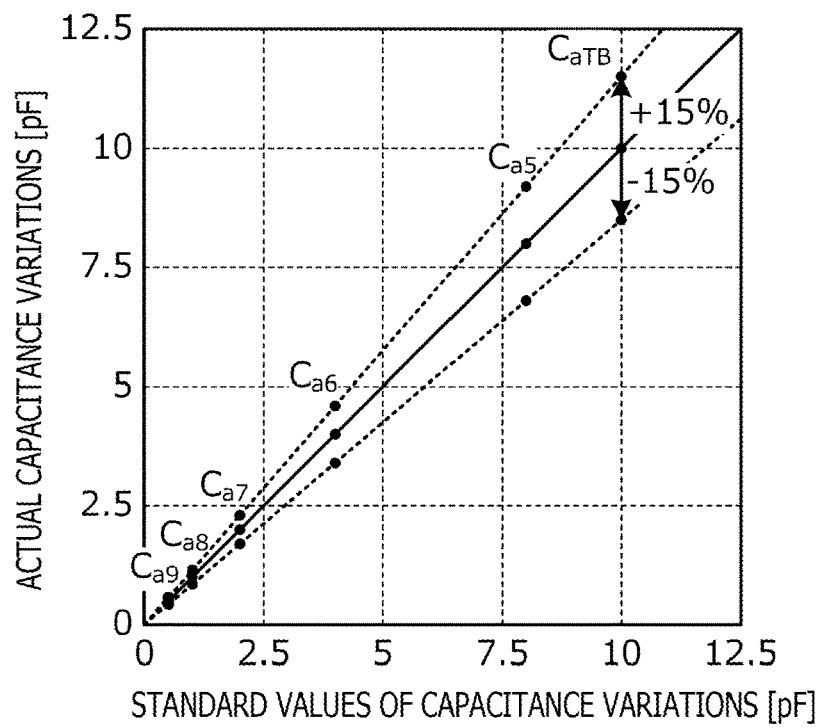
FIG. 6B is an enlarged graphic representation of relations between the values near the origin of the graph in FIG. 6A.

FIG. 6A is a graphic representation indicating relations between the standard values of the capacitance variations resulting from application of the potential Vc to each capacitor $C_a$ on one hand and actual capacitance variations resulting from application of the potential Vc on the other hand. FIG. 6B is an enlarged graphic representation of relations between the values near the origin of the graph in FIG. 6A. As described above, the capacitors $C_{aTB}$ and $C_{a1}$ through $C_{a9}$ each include at least one minimum capacitance cell $C_{MIN}$ formed on the same substrate 20 by the same process. As a result, the manufacturing error occurring in each of the capacitors $C_{aTB}$ and $C_{a1}$ through $C_{a9}$ is substantially the same. For example, if a manufacturing error of +15% occurs in the capacitor $C_{aTB}$, then the manufacturing error of +15% is assumed to occur in each of the capacitors $C_{a1}$ through $C_{a9}$. Likewise, if a manufacturing error of −15% occurs in the capacitor $C_{aTB}$, the manufacturing error of −15% is assumed to occur in each of the capacitors $C_{a1}$ through $C_{a9}$. Thus, as indicated in FIGS. 6A and 6B, the relations between the standard values of the capacitance variations resulting from application of the potential Vc to each capacitor $C_a$ on one hand and actual capacitance variations resulting from application of the potential Vc on the other hand are plotted on a straight line with a gradient reflecting the magnitude of the manufacturing errors involved. In the description that follows, this gradient of the straight line will be referred to as the "capacitance change gradient."

The external apparatus 30 estimates with high accuracy the capacitance variations in the capacitors $C_{a1}$ through $C_{a9}$ by making use of the above-described properties of the capacitors $C_{aTB}$ and $C_{a1}$ through $C_{a9}$. The capacitance variations thus estimated are used as a reference for adjusting the reference resonance frequency of the first resonance circuit. A process performed by the external apparatus 30 is explained below in specific terms with reference to the accompanying process flowcharts.

Figure 7:
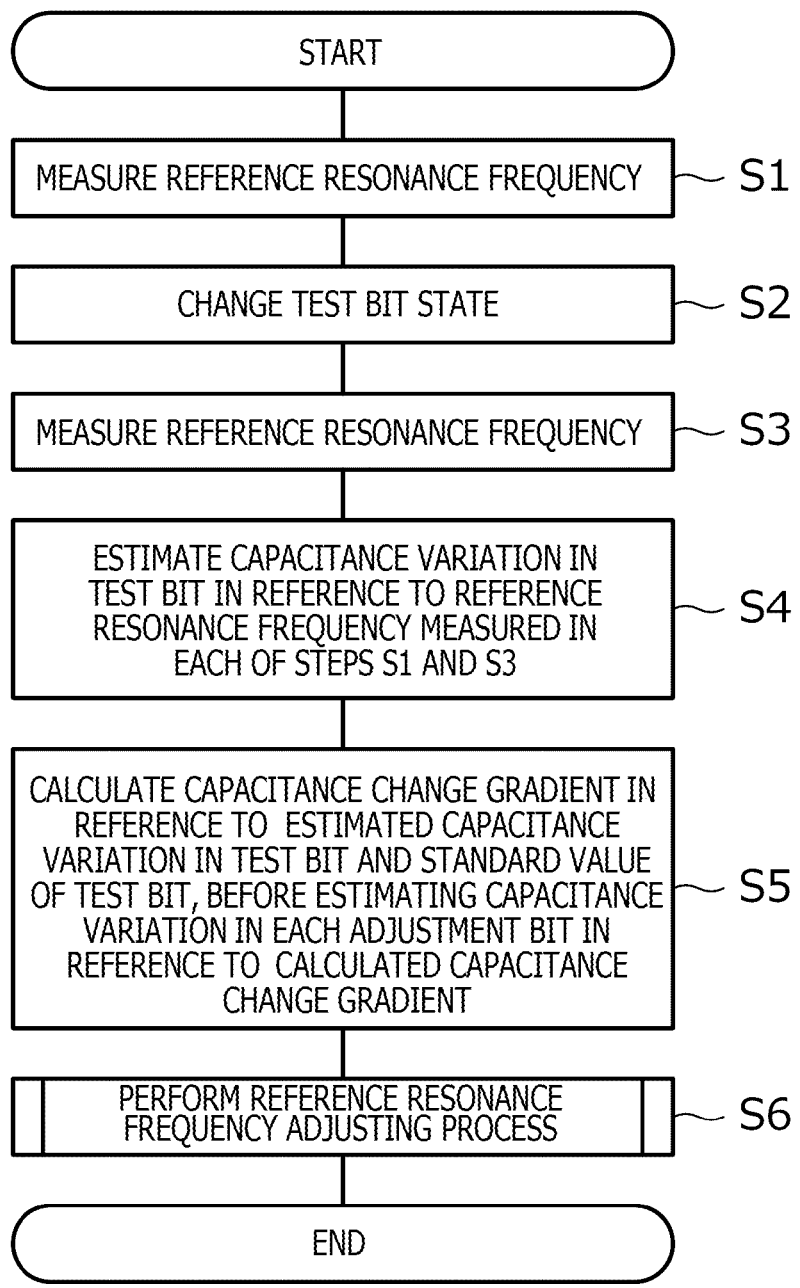
FIG. 7 is a flowchart depicting the process of adjusting the reference resonance frequency of a first resonance circuit, the process being performed by an external apparatus 30.

FIG. 7 is a flowchart depicting the process of adjusting the reference resonance frequency of the first resonance circuit, the process being performed by an external apparatus 30. This process is carried out as part of the process of manufacturing the electronic pen 1. In the ensuing description, the capacitive element CD including the capacitor $C_{aTB}$ may be referred to as a "test bit," and multiple capacitive elements CD each including the capacitors $C_{a1}$ through $C_{a9}$ may be referred to as "adjustment bits."

As depicted in FIG. 7, the external apparatus 30 first measures the reference resonance frequency of the first resonance circuit (step S1; a first measuring step). The external apparatus 30 then writes to the above-mentioned capacitor bit area in a manner causing the control circuit 10 to perform a predetermined process that changes the state (step S2; state-changing step) of the test bit (which is a predetermined capacitive element CD among the capacitive elements). In this embodiment, the predetermined process of the control circuit 10 involves injecting electrons into the floating gate 22 (see FIG. 4) of the capacitors $C_a$ included in the capacitive element CD by application of the potential Vc, to change the capacitance value of the capacitors $C_a$. The control circuit 10 again measures the reference resonance frequency of the first resonance circuit (step S3; a second measuring step). In reference to the reference resonance frequencies measured in step S1 and S3 (i.e., reference resonance frequencies before and after the test bit state change), the control circuit 10 estimates an actual capacitance variation in the test bit (step S4; a first estimating step). Specifically, an actual capacitance variation $C_{aTBr}$ in the test bit is calculated by using the mathematical equation (3) below. In the equation (3), L stands for the inductance of the coil L depicted in FIG. 3; $f_1$ denotes the reference resonance frequency measured in step S1; and $f_2$ represents the reference resonance frequency measured in step S3.

Equation 3

$$C_{aTBr} = \frac{1}{4\pi^2 L}\left(\frac{1}{f_1^2} - \frac{1}{f_2^2}\right) \qquad (3)$$

In reference to the estimated capacitance variation in the test bit and the standard value of the capacitance variation in the test bit, the external apparatus 30 then calculates the capacitance change gradient explained above with reference to FIGS. 6A and 6B (i.e., manufacturing error common to the test bit and to the multiple adjustment bits). For example, if the estimated capacitance variation in the test bit is 15% larger than the standard value of the capacitance variation in the test bit, the capacitance change gradient is calculated to be 1.15. In reference to the capacitance change gradient thus calculated, the external apparatus 30 estimates an actual capacitance variation in each adjustment bit (step S5; second estimating step). For example, if the calculated capacitance change gradient is 1.15, then the actual capacitance variation in the capacitive element (see FIG. 5B) including the capacitor $C_{a3}$ of which the standard value of the capacitance variation is 30 pF is calculated to be 30×1.15=34.5 pF. Thereafter, in reference to the actual capacitance variation in each adjustment bit estimated in step S6, the external apparatus 30 performs a reference resonance frequency adjusting process of adjusting the reference resonance frequency of the first resonance circuit (step S6; adjusting step).

Figure 8:
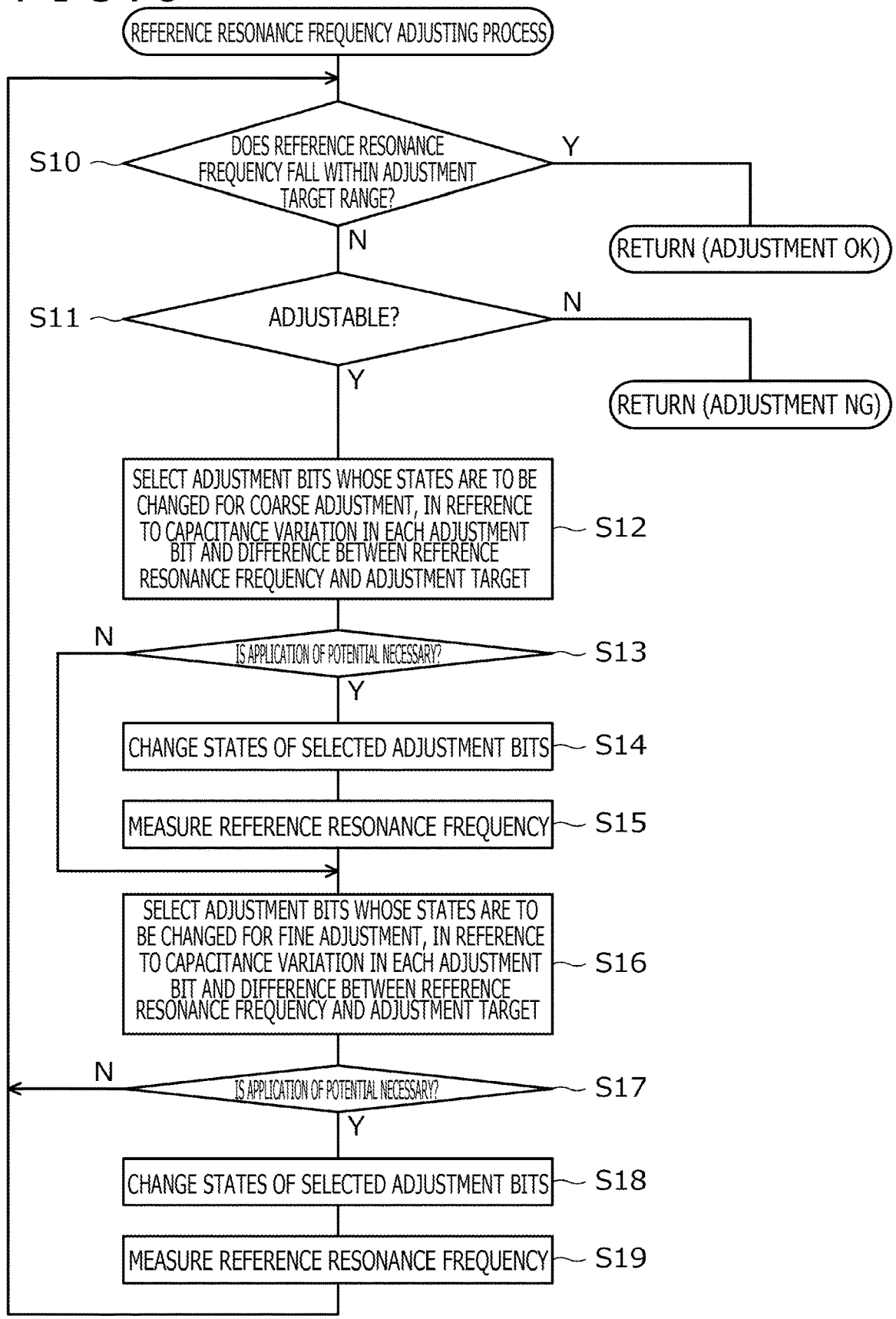
FIG. 8 is a flowchart depicting details of a reference resonance frequency adjusting process performed in step S6 of FIG. 7.

FIG. 8 is a flowchart depicting details of the reference resonance frequency adjusting process performed in step S6 of FIG. 7. In this process, in a case where the difference between the reference resonance frequencies before and after the test bit state change is relatively large, the external apparatus 30 selects at least one capacitive element CD to be changed in state, in such a manner that the sum of the standard values of the capacitance variations in such capacitive elements CD of which the state is to be changed becomes smaller than in the case where the difference is relatively small, and changes the state of the selected at least one capacitive element CD (part or all of the adjustment bits). Explained in specific terms, as indicated in FIG. 8, the external apparatus 30 first determines whether or not the most recently measured reference resonance frequency falls within an adjustment target range (step S10). The adjustment target range is a range of reference resonance frequency values necessary for normal communication with the position detection apparatus, the range being defined by electronic pen standards. If the result of the determination in step S10 is affirmative, the external apparatus 30 sends an adjustment OK return, and terminates the process.

On the other hand, if the result of the determination in step S10 is negative, the external apparatus 30 determines whether or not the reference resonance frequency is adjustable within the adjustment target range (step S11). Specifically, using the capacitance variations in the adjustment bits estimated in step S6, the external apparatus 30 estimates the reference resonance frequency to be obtained by application of the potential Vc to all adjustment bits. If any part of the adjustment target range falls between the reference resonance frequency measured in step S3 and the estimated reference resonance frequency, the reference resonance frequency is determined to be adjustable. If not, the reference resonance frequency is determined not to be adjustable. If the result of the determination is that the reference resonance frequency is not adjustable, the external apparatus 30 sends an adjustment NG return and terminates the process. In this case, the electronic pen 1 being processed is regarded as a defective product and is to be discarded.

Upon determining in step S11 that the reference resonance frequency is adjustable, the external apparatus 30 selects the adjustment bits of which the state is to be changed for coarse adjustment, in reference to the capacitance variation in each adjustment bit (the values estimated in step S6) and to the difference between the most recently measured reference resonance frequency on one hand and the adjustment target (e.g., the closest value to the last-measured reference resonance frequency among the values within the adjustment target range) on the other hand (step S12). For example, when the adjustment bits to be selected are only those in which the capacitive variation is relatively large (e.g., four capacitive elements CD each including capacitors $C_{a1}$ through $C_{a4}$), the adjustment bits are selected in such a manner that the reference resonance frequency becomes as close to the adjustment target as possible without exceeding it.

The external apparatus 30 then determines whether or not at least one adjustment bit of which the state is to be changed has been selected in step S12 (step S13). If at least one adjustment bit is determined to have been selected, the external apparatus 30 causes the control circuit 10 to perform the above-mentioned predetermined process by performing a writing operation to the capacitor bit area discussed above, thereby changing the state of the selected adjustment bits (step S14). The external apparatus 30 proceeds to again measure the reference resonance frequency of the first resonance circuit (step S15).

At the end of step S15 or upon determination in step S13 that no adjustment bit has been selected, the external apparatus 30 selects the adjustment bits of which the state is to be changed for fine adjustment, in reference to the capacitance variation in each adjustment bit (the value measured in step S6) and to the difference between the most recently measured reference resonance frequency and the adjustment target (step S16). For example, when the adjustment bits to be selected are only those of which the capacitive variation is relatively small (e.g., five capacitive elements CD each including capacitors $C_{a5}$ through $C_{a9}$), the adjustment bits are selected in such a manner that the reference resonance frequency becomes as close to the adjustment target as possible. The reason why the coarse adjustment of steps S12 through S14 and the fine adjustment of steps S16 through S18 are performed separately from each other is that it is difficult to accurately predict the reference resonance frequency to be obtained as a result of a change of the capacitive element state before actually implementing the change.

The external apparatus 30 then determines whether or not at least one adjustment bit the state of which is to be changed has been selected in step S16 (step S17). Upon determination that at least one adjustment bit has been selected, the external apparatus 30 causes the control circuit 10 to perform the above-mentioned predetermined process by performing a writing operation to the capacitor bit area discussed above, thereby changing the state of the selected adjustment bits (step S18). The external apparatus 30 proceeds to again measure the reference resonance frequency of the first resonance circuit (step S19).

At the end of step S19 or upon determination in step S17 that no adjustment bit has been selected, the external apparatus 30 returns control to step S10. This causes the subsequent steps to be repeated. Eventually, with either the adjustment OK or the adjustment NG returned as the result, the process is terminated.

Explained so far is the case where the reference resonance frequency of the first resonance circuit is adjusted by adjusting the capacitance value of the capacitor array $C_{1ARRAY}$. A similar explanation applies to a case where, after adjustment of the reference resonance frequency of the first resonance circuit is completed, the reference resonance frequency of the second resonance circuit is adjusted by adjustment of the capacitance value of the capacitor array $C_{2ARRAY}$. In this case, however, there is no need to repeat steps S1 through S5 in FIG. 7 because the multiple minimum capacitance cells $C_{MIN}$ constituting the capacitor array $C_{2ARRAY}$ and those making up the capacitor array $C_{1ARRAY}$ are formed on the same substrate by the same process. The reference resonance frequency adjusting process depicted in FIG. 8 need only be carried out on each capacitive element CD in the capacitor array $C_{2ARRAY}$ by using the capacitance change gradient calculated in step S5 of FIG. 7 at the time of adjusting the reference resonance frequency of the first resonance circuit. Also, there is no need to provide the test bit in the capacitor array $C_{2ARRAY}$. Needless to say, apart from adjustment of the reference resonance frequency of the first resonance circuit, steps S1 through S5 in FIG. 7 may be carried out for adjusting the reference resonance frequency of the second resonance circuit with the test bit provided in the capacitor array $C_{2ARRAY}$.

As described above, according to the method for manufacturing the electronic pen 1 of this embodiment, when each capacitive element CD is to be configured using the capacitors $C_a$ having the floating gates, the reference resonance frequency can be adjusted after the capacitance variation in each of the multiple adjustment bits is estimated using the test bit. This makes it possible to suitably adjust the reference resonance frequencies of the first and second resonance circuits.

Also, according to the integrated circuit 6 of this embodiment, the multiple capacitive elements CD constituting the capacitor arrays $C_{1ARRAY}$ and $C_{2ARRAY}$ include a test-use capacitive element CD switched necessarily to the changed state in the manufacturing stage. This makes it possible to estimate the capacitance variation in each of the multiple adjustment bits.

For this embodiment, an example in which the floating gate 22 includes an n-type semiconductor has been explained. Alternatively, the floating gate 22 may be configured using a p-type semiconductor such as polysilicon doped with p-type impurities. This alternative case is explained below with reference to FIG. 9.

FIG. 9 is a schematic cross-sectional view of a minimum capacitance cell $C_{MIN}$ as an alternative example of the first embodiment of the present invention. The example in FIG. 9 is different from the example in FIG. 4 in that the substrate 20 includes a silicon substrate (p-type semiconductor) doped with p-type impurities, in that the floating gate 22 includes polysilicon (p-type semiconductor) doped with p-type impurities, and in that the potential Vc is lower than the ground potential GND.

In a case where the potential Vc is applied over a predetermined time period to the minimum capacitance cell $C_{MIN}$ in the example of FIG. 9 in the manner discussed above, holes (positive holes) in the substrate 20 are attracted to a portion near the boundary with the insulating film 21. Some of the holes migrate into the floating gate 22 due to the tunnel effect. The holes accumulated in the floating gate 22 remain there even after application of the potential Vc is stopped. That is, the floating gate 22 is depleted. This allows the control circuit 10 to change the capacitance of the minimum capacitance cell $C_{MIN}$ as in the case of the minimum capacitance cell $C_{MIN}$ in the example of FIG. 4. In this case, too, the above-mentioned predetermined process involves injecting electrons into the floating gate 22 of the capacitors $C_a$ included in the capacitive element CD by application of the potential Vc, to change the capacitance value of the capacitors $C_a$. In the example of FIG. 9, it is also preferred that the potential Vc be continuously applied until the floating gate 22 is fully depleted, to stabilize the capacitance of the depletion layer.

It is also possible to configure the minimum capacitance cell $C_{MIN}$ by using not the floating gate type flash memory but a structure similar to the charge trap type flash memory. In this case, the above-described predetermined process would involve injecting electrons into a charge trap insulating film of the capacitors included in the capacitive element CD by application of a predetermined potential, to change the capacitance values of the capacitors.

A second embodiment of the present invention is explained next. The second embodiment differs from the first embodiment in that each capacitive element CD includes fuse elements H in place of the switches $S_a$ and $S_b$. The other aspects of the second embodiment are similar to those of the first embodiment, so that like components in the second embodiment are denoted by like reference signs. In the description that follows, the emphasis is on what differentiates the second embodiment from the first embodiment.

Figure 10:
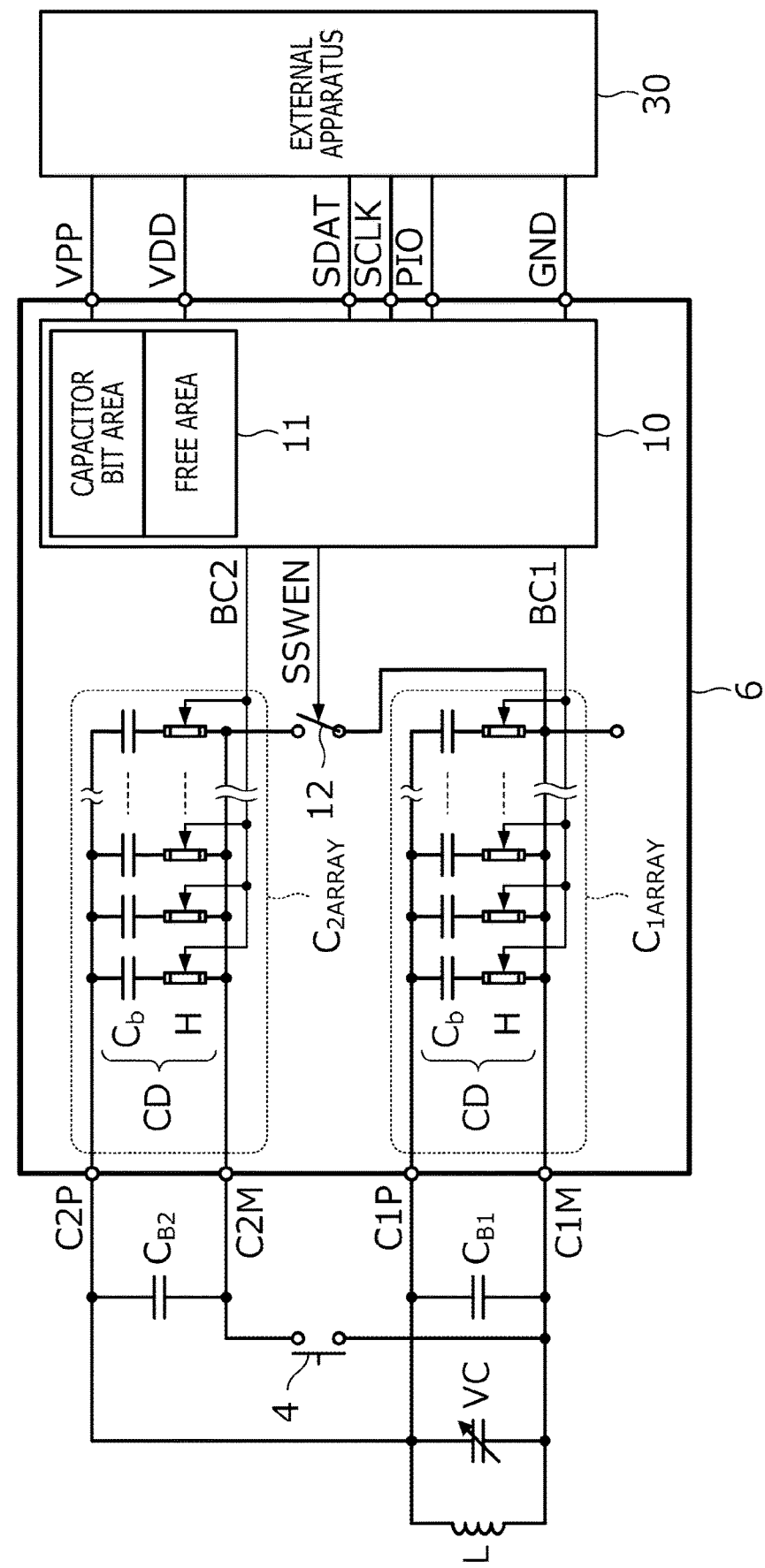
FIG. 10 is a diagram depicting a circuit configuration of an integrated circuit 6 and an electronic pen 1 as a second embodiment of the present invention.

FIG. 10 is a diagram depicting a circuit configuration of an integrated circuit 6 and an electronic pen 1 as the second embodiment. As depicted in FIG. 10, the capacitive element CD in this embodiment includes a capacitor $C_b$ and a fuse element H connected in series in that order. The capacitors $C_b$ are not limited to any specific type of capacitor. Various capacitors such as metal-insulator-metal (MIM) or metal-oxide-metal (MOM) capacitors produced in the semiconductor manufacturing process may be used as the capacitors $C_b$.

In the second embodiment, the state of a capacitive element CD is changed by application of a predetermined voltage to the fuse element H included in that capacitive element CD, in order to change the fuse element H from a state in which the fuse element H is not cut (i.e., initial state) to a state in which the fuse element H is cut (changed state). That is, the above-described predetermined process with this embodiment involves cutting the fuse element H included in the capacitive element CD to be processed.

Explained in specific terms, upon changing the state of a particular capacitive element CD in step S2 of FIG. 7 or in step S14 or S18 of FIG. 8, the external apparatus 30 controls the control circuit 10 to supply the control signal BC1 to cut the fuse element H in that capacitive element CD. The signal causes the fuse element H to be cut, disconnecting the corresponding capacitor $C_b$ from the circuit. As a result, the state of the corresponding capacitive element CD is changed. The capacitance variation in the capacitive element CD following the cut of the fuse element H becomes equal to the capacitance of the capacitor $C_b$.

In the second embodiment, too, at least one capacitive element CD in the capacitor arrays $C_{1ARRAY}$ and $C_{2ARRAY}$ is used as the test bit. Thus, according to the method for manufacturing the electronic pen 1 of the second embodiment, in a case where each capacitive element CD is configured to have the fuse element H connected in series to the capacitor $C_b$, the reference resonance frequency can be adjusted by estimating the capacitance variation in each of multiple adjustment bits with use of the test bit. This makes it possible to appropriately adjust the reference resonance frequencies of the first and second resonance circuits.

In the integrated circuit 6 of the second embodiment, among the multiple capacitive elements CD making up the capacitor arrays $C_{1ARRAY}$ and $C_{2ARRAY}$ is the test-use capacitive element CD switched necessarily to the changed state in the manufacturing stage. This makes it possible to estimate the capacitance variation in each of the multiple adjustment bits.

For the second embodiment, an example in which the fuse element H is connected in series to each capacitor $C_b$ has been explained. Alternatively, other types of elements may be used. For example, an anti-fuse element may be connected in series to each capacitor $C_b$. As another alternative, a Micro Electro Mechanical Systems (MEMS) switch such as a MEMS cantilever may be employed.

As opposed to the fuse element H, the anti-fuse element does not conduct in its initial state. When supplied with a voltage of at least a predetermined level, the anti-fuse element enters a conductive state (changed state). Consequently, the control circuit 10 can change the state of each capacitive element CD by causing the anti-fuse element to conduct in the capacitive element CD. In this case, the above-described predetermined process involves causing conduction of the anti-fuse element included in the capacitive element CD to be processed.

The MEMS switch is an element that is turned on and off by application of a voltage. Either the on-state or the off-state may be used as the initial state of the MEMS switch. The control circuit 10 can change the state of each capacitive element CD by switching the on/off-state of the MEMS switch in the capacitive element CD. In this case, the above-described predetermined process involves switching the on/off-state of the MEMS switch included in the capacitive element CD to be processed.

A third embodiment of the present invention is explained next. The third embodiment differs from the first embodiment in that the pen information is transmitted in terms of the difference between the resonance frequencies of the resonance circuits in the electronic pen 1, not in terms of the resonance frequencies themselves, and in that the capacitance of the variable capacitance capacitor can be varied. The other aspects of the third embodiment are similar to those of the first embodiment including the fact that at least one test bit is included in the capacitance arrays $C_{1ARRAY}$ and $C_{2ARRAY}$. In the description that follows, like components in the third embodiment are thus denoted by like reference signs, with emphasis on what differentiates the third embodiment from the first embodiment.

Figure 11:
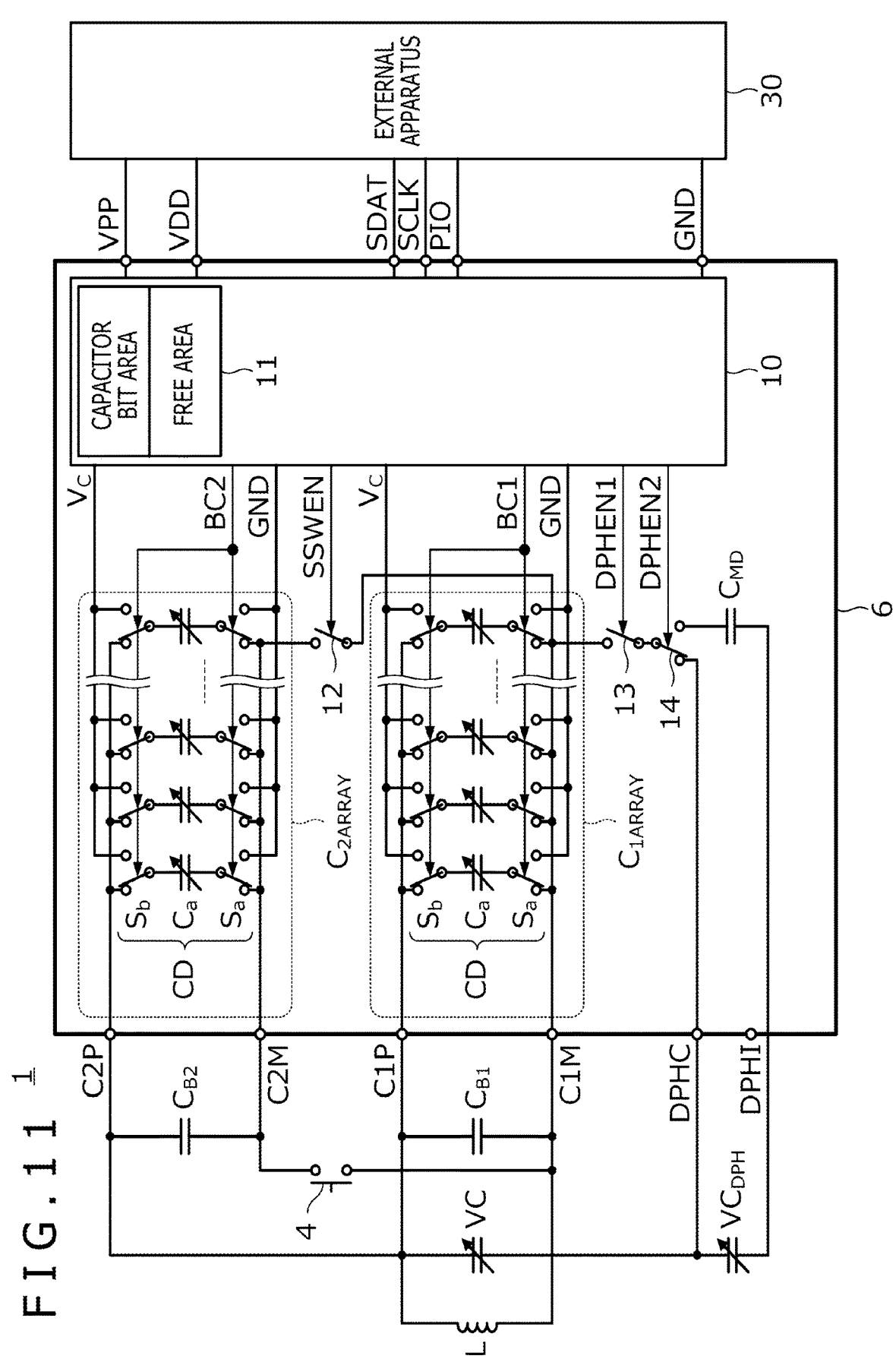
FIG. 11 is a diagram depicting a circuit configuration of an integrated circuit 6 and an electronic pen 1 as a third embodiment of the present invention.

FIG. 11 is a diagram depicting a circuit configuration of an integrated circuit 6 and an electronic pen 1 as the third embodiment. As depicted in FIG. 11, the electronic pen 1 of the third embodiment is configured to additionally have a variable capacitance capacitor $VC_{DPH}$. As with the variable capacitance capacitor VC, the variable capacitance capacitor $VC_{DPH}$ is configured to have its capacitance varied in accordance with the writing pressure applied to the pen tip member 3 (see FIG. 1). The integrated circuit 6 is configured to additionally have switches 13 and 14, a fixed capacitance capacitor $C_{MD}$, and terminals DPHC and DPHI connected to the resonance circuit.

With attention first directed to the outside of the integrated circuit 6, the other end of the variable capacitance capacitor VC in the third embodiment is connected not to the terminal C1M but to the terminal DPHC. The variable capacitance capacitor $VC_{DPH}$ is connected to the terminals DPHC and DPHI between them.

With attention next directed to the inside of the integrated circuit 6, the switch 13 is interposed between the terminal C1M and a common terminal of the switch 14. The switch 14 includes a common terminal connected to one end of the switch 13, a first select terminal connected to the terminal DPHC, and a second select terminal connected to the terminal DPHI via the fixed capacitance capacitor $C_{MD}$.

The control circuit 10 is configured to provide the function of controlling the on/off-state of the switch 13 by using a control signal DPHEN1 according to instructions from the position detection apparatus, and the function of controlling the selected state of the switch 14 by using a control signal DPHEN2 according to instructions from the position detection apparatus.

The position detection apparatus corresponding to the electronic pen 1 of the third embodiment is configured to receive the pen information transmitted from the electronic pen 1 in terms of the difference between the resonance frequency (referred to as the "first resonance frequency" hereunder) of the resonance circuit including the variable capacitance capacitor VC (above-described first and second resonance circuits) on one hand, and the resonance frequency (referred to as the "second resonance frequency" hereunder) of the resonance circuit excluding the variable capacitance capacitor VC (the first and second resonance circuits minus the variable capacitance capacitor VC) on the other hand.

Explained in specific terms, the position detection apparatus first gives the electronic pen 1 an instruction to turn on the switch 13 and to connect the switch 14 to the first select terminal. This instruction may be given by changing the transmission continuation time of an electrical field from an unillustrated sensor coil (see Patent Document 2 for more details). In a case where the electronic pen 1 and the position detection apparatus support some other communicating means (e.g., short-range wireless communication such as Bluetooth®), such communicating means may be used. This applies to the other instructions to be described below. The resonance frequency detected by the position detection apparatus after giving the instruction is the first resonance frequency reflecting the writing pressure and the state of the operation switch 4.

The position detection apparatus then gives the electronic pen 1 an instruction to turn off the switch 13. The resonance frequency detected by the position detection apparatus after giving this instruction is the second resonance frequency not reflecting the writing pressure.

The position detection apparatus acquires the difference between the first and second resonance frequencies detected in the manner described above and, in reference to the acquired difference, obtains the pen information. The pen information acquisition thus carried out enables the position detection apparatus to detect the pen information accurately even in cases where the reference resonance frequencies of the first and second resonance circuits, initially equal to their standard values upon shipment, have been varied due, for example, to proximity to metal, temperature fluctuation, or aging, as the variations are canceled out by the acquired difference.

The position detection apparatus corresponding to the electronic pen 1 of the third embodiment is configured to change writing pressure curves (i.e., curves indicative of relations between the writing pressure applied to the pen tip member 3 on one hand and the variations in the resonance frequency on the other hand) in reference to a user's operations.

Explained in specific terms, the electronic pen 1 of the third embodiment supports two writing pressure curves: a first writing pressure curve corresponding to a state in which the variable capacitance capacitor $VC_{DPH}$ and the fixed capacitance capacitor $C_{MD}$ are disconnected from the first and second resonance circuit; and a second writing pressure curve corresponding to a state in which the variable capacitance capacitor $VC_{DPH}$ and the fixed capacitance capacitor $C_{MD}$ are connected in series to the variable capacitance capacitor VC. The position detection apparatus selects either of the first and second writing pressure curves according to the user's operations. In a case where the first writing pressure curve is selected, the position detection apparatus gives the electronic pen 1 the instruction to turn on the switch 13 and to connect the switch 14 to the first select terminal. In a case where the second writing pressure is selected, the position detection apparatus gives the electronic pen 1 the instruction to turn on the switch 13 and to connect the switch 14 to the second select terminal. In response to the instructions, the electronic pen 1 controls the states of the switches 13 and 14 accordingly. This makes it possible to change the writing pressure curves of the electronic pen 1 according to the user's input and, consequently, to vary the user-experiencing sense of writing of the electronic pen 1 in two ways (i.e., two ways of how it feels to draw using the electronic pen 1).

As explained above, the integrated circuit 6 and the electronic pen 1 of the third embodiment have the advantageous effects similar to those of the first and second embodiments and additionally have a beneficial effect of enabling the position detection apparatus to accurately detect the pen information regardless of the reference resonance frequency variations due, for example, to proximity to metal, temperature fluctuation, or aging following the adjustment of the reference resonance frequency. With the resultant improvement in the accuracy in writing pressure detection, the position detection apparatus can set to a lower level a writing pressure threshold value (ON load) for determining whether or not the electronic pen 1 is in contact with the touch surface.

According to the integrated circuit 6 and the electronic pen 1 of the third embodiment, it is also possible to vary the user-experiencing sense of writing (how it feels to draw) of the electronic pen 1 in two ways according to the user's input.

While the preferred embodiments of the present invention have been described above, the present invention is not limited to these embodiments and may be implemented in diverse variations so far as they are within the technical scope of the present invention.

For example, the above embodiments have been described in conjunction with the case in which the pen information is transmitted in terms of resonance frequency variations. Alternatively, the present invention may be applied in a case where the pen information is transmitted as digital information provided by turning on and off the supply of signals to the resonance circuit in a manner reflecting the content of the pen information. That is, in this case too, the integrated circuit may be configured to have multiple capacitive elements connected in parallel with the capacitors constituting the resonance circuit. The reference resonance frequency of the resonance circuit may then be varied by individually changing the state of each of the capacitive elements configured.

The above embodiments have been described in connection with examples in which a tablet terminal is used as the measurement apparatus 31. Alternatively, at least one other apparatus, such as an oscilloscope, or an impedance analyzer, and a personal computer, may be used to constitute the measurement apparatus 31.

The above embodiments have been described in conjunction with examples in which the present invention is applied to the electronic pen for use in the EMR input system. Alternatively, the present invention may be applied to a near-field communication (NFC) card or to an EM pen configured to operate resonance circuits by using its own power supply without receiving external power. In the case where the present invention is applied to the EM pen, it is possible to use a measurement apparatus 31 without the function of generating magnetic fields.

DESCRIPTION OF REFERENCE SYMBOLS

1: Electronic pen
2: Housing
3: Pen tip member
4: Operation switch
5, 20: Substrate
6: Integrated circuit
7: Pad
10: Control circuit
11: Memory
12, 13, 14: Switch
21: Insulating film
22: Floating gate
23: Gate electrode
30: External apparatus
31: Measurement apparatus
32: Adjustment apparatus
33: Probe
BC1, BC2: Control signal
$C_{1ARRAY}$, $C_{2ARRAY}$: Capacitor array
C1P, C1M, C2P, C2M: Terminal
$C_a$, $C_{aTB}$, $C_{a1}$~$C_{a9}$, $C_b$: Capacitor
$C_{aTBr}$: Capacitance variation
$C_{B1}$, $C_{B2}$, $C_{MD}$: Fixed capacitance capacitor
CD: Capacitive element
$C_{MIN}$: Minimum capacitance cell
DPHC, DPHI: Terminal
DPHEN1, DPHEN2: Control signal
GND: Ground terminal, ground potential
H: Fuse element
L: Coil, inductance
PIO: Reserve terminal
$S_a$, $S_b$: Switch
SCLK: Clock terminal, operation clock signal
SDAT: Data terminal, data
SSWEN: Enable signal
VC, $VC_{DPH}$: Variable capacitance capacitor
Vc: Potential
VDD: Power supply terminal, potential
VPP: Power supply terminal, potential

The invention claimed is:

1. An integrated circuit for an electronic pen, comprising:
an internal capacitor array including a plurality of capacitive elements connected in parallel,
wherein the internal capacitor array includes a mixture of a portion of the capacitive elements of which a state has been changed by a predetermined process and the remaining capacitive elements of which the state remains unchanged,
wherein the remaining capacitive elements and a coil form a resonance circuit, and
circuitry, which is coupled to the internal capacitor array and which is configured to control the electronic pen to transmit a signal using the resonance circuit.

2. The integrated circuit according to claim 1, comprising a pin for receiving input of a voltage, a current, a signal, and a command from external adjusting means for adjusting a capacitance of the internal capacitor array.

3. The integrated circuit according to claim 1, wherein each of the plurality of capacitive elements has a different capacitive variation resulting from the predetermined process, and
each of the plurality of capacitive elements is a unit according to which the state change performed by the predetermined process is controlled.

4. The integrated circuit according to claim 3, wherein the portion of the plurality of the capacitive elements includes a capacitive element in which a capacitance variation resulting from the predetermined process is not minimal.

5. The integrated circuit according to claim 1, wherein each of the plurality of capacitive elements includes a capacitor having a floating gate formed on a substrate, and
the predetermined process changes a capacitance value of the capacitor by injecting electrical charges into the floating gate of the capacitor included in the capacitive element to be processed.

6. The integrated circuit according to claim 1, wherein each of the plurality of capacitive elements includes a capacitor having a charge trap insulating film formed on a substrate, and
the predetermined process changes a capacitance value of the capacitor by injecting electrical charges into the charge trap insulating film of the capacitor included in the capacitive element to be processed.

7. The integrated circuit according to claim 1, wherein each of the plurality of capacitive elements includes a capacitor and a fuse element connected in series, and
the predetermined process cuts the fuse element included in the capacitive element to be processed.

8. The integrated circuit according to claim 1, wherein each of the plurality of capacitive elements includes a capacitor and an anti-fuse element connected in series, and
the predetermined process causes conduction of the anti-fuse element included in the capacitive element to be processed.

9. The integrated circuit according to claim 1, wherein each of the plurality of capacitive elements includes a capacitor and a Micro Electro Mechanical Systems switch connected in series, and
the predetermined process switches an on/off-state of the Micro Electro Mechanical Systems switch included in the capacitive element to be processed.

* * * * *